United States Patent
Satoh

(10) Patent No.: US 9,111,719 B1
(45) Date of Patent: Aug. 18, 2015

(54) METHOD FOR ENHANCING BEAM UTILIZATION IN A SCANNED BEAM ION IMPLANTER

(71) Applicant: Axcelis Technologies, Inc., Beverly, MA (US)

(72) Inventor: Shu Satoh, Byfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 17 days.

(21) Appl. No.: 14/168,770

(22) Filed: Jan. 30, 2014

(51) Int. Cl.
*H01J 37/304* (2006.01)
*H01J 37/30* (2006.01)
*H01J 37/317* (2006.01)

(52) U.S. Cl.
CPC ........... *H01J 37/304* (2013.01); *H01J 37/3007* (2013.01); *H01J 37/3171* (2013.01); *H01J 2237/30472* (2013.01)

(58) Field of Classification Search
USPC .................................................... 250/492.21
See application file for complete search history.

(56) References Cited

U.S. PATENT DOCUMENTS

| | | | |
|---|---|---|---|
| 5,068,539 A * | 11/1991 | Nogami et al. | 250/492.2 |
| 6,646,277 B2 * | 11/2003 | Mack et al. | 250/492.21 |
| 6,847,036 B1 * | 1/2005 | Darling et al. | 250/291 |
| 6,858,854 B2 * | 2/2005 | Keum et al. | 250/492.21 |

* cited by examiner

*Primary Examiner* — Phillip A Johnston
(74) *Attorney, Agent, or Firm* — Eschweiler & Associates, LLC

(57) ABSTRACT

A dosimetry system and method are provided for increasing utilization of an ion beam, wherein one or more side Faraday cups are positioned along a path of the ion beam and configured to sense a current thereof. The one or more side Faraday cups are separated by a distance associated with a diameter of the workpiece. The ion beam reciprocally scans across the workpiece, interlacing narrow scans and wide scans, wherein narrow scans are defined by reversing direction of the scanning near an edge of the workpiece, and wide scans are defined by reversing direction of the scanning at a position associated with an outboard region of the side Faraday cups. A beam current is sensed by the side Faraday cups concurrent with scanning the beam, wherein the side Faraday cups are connected to a dosimeter only concurrent with a wide scan of the ion beam, and are disconnected concurrent with narrow scans of the ion beam. The side Faraday cups are further connected to ground concurrent with narrow scans of the ion beam.

15 Claims, 7 Drawing Sheets

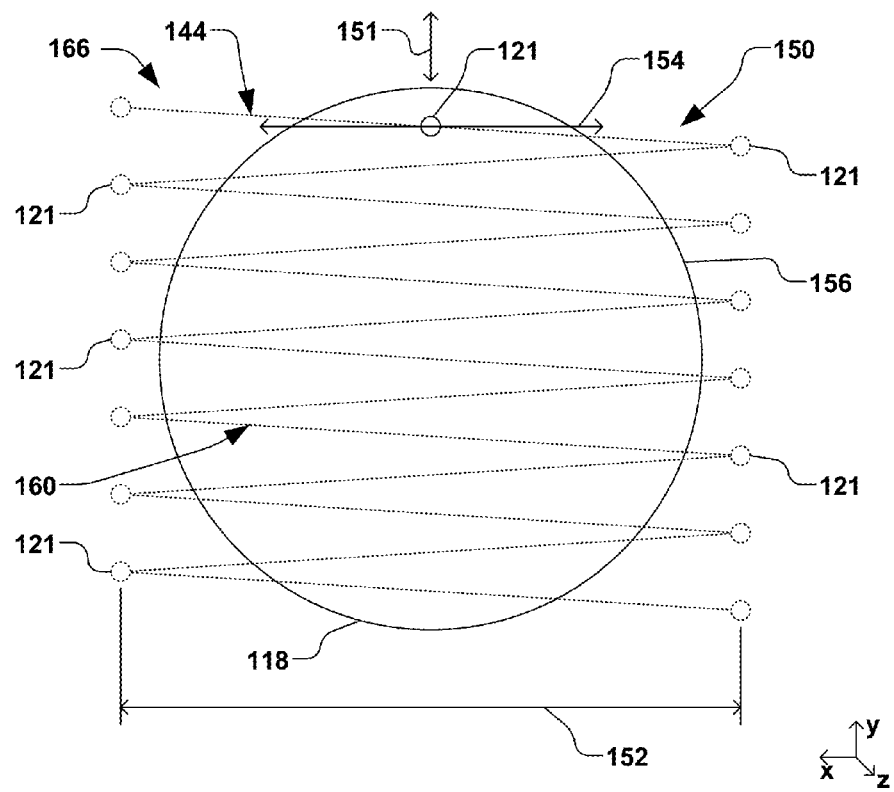
FIG. 2
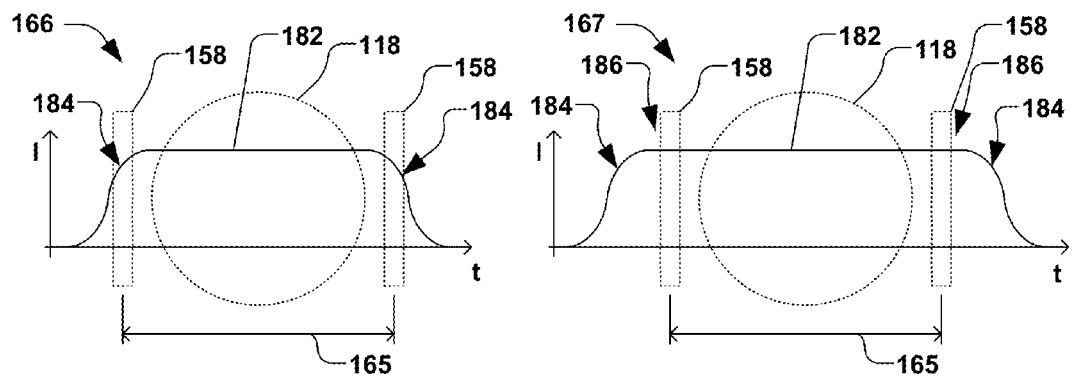
FIG. 3A   FIG. 3B

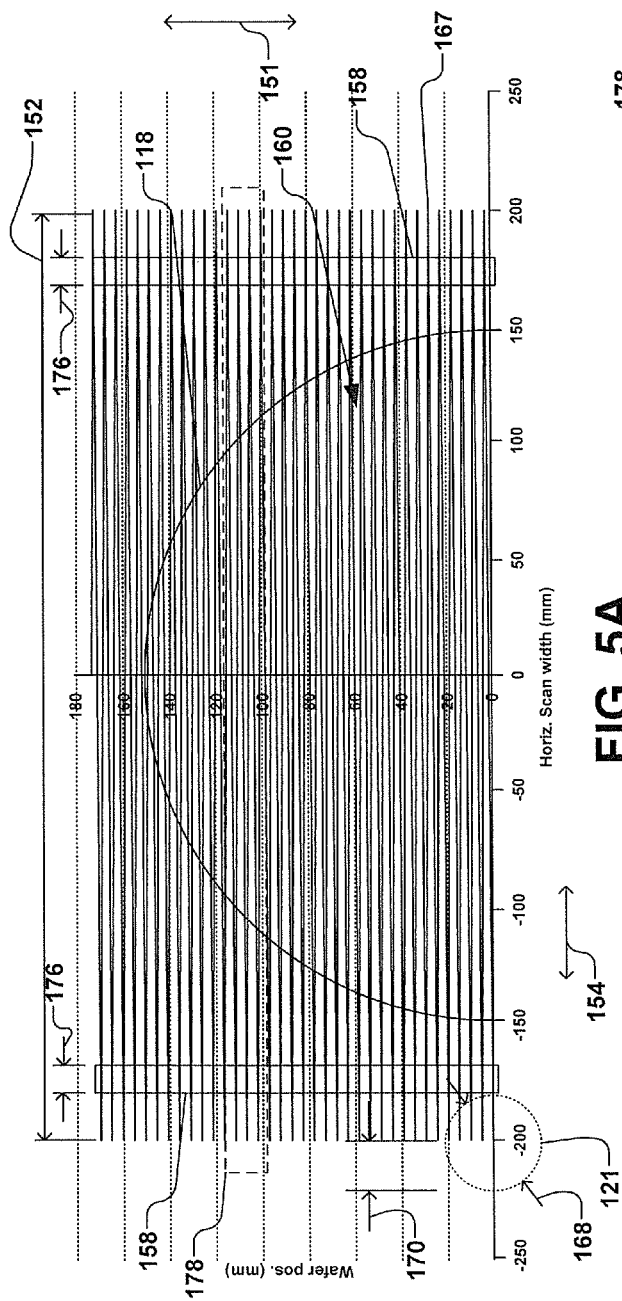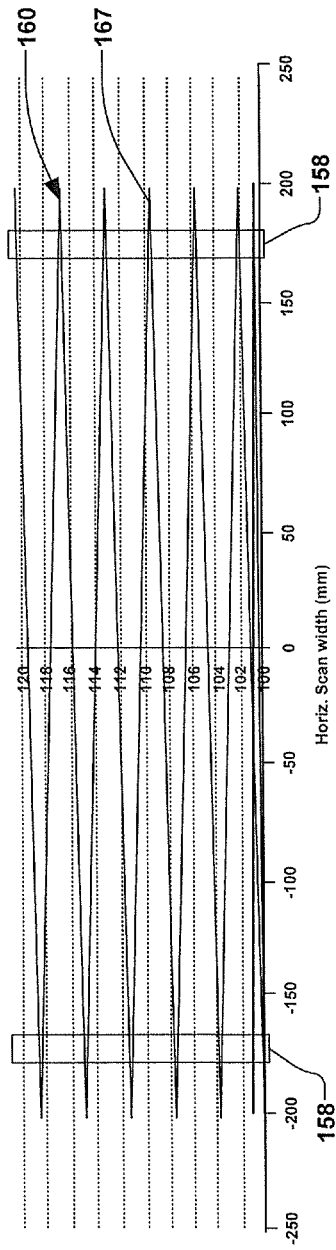

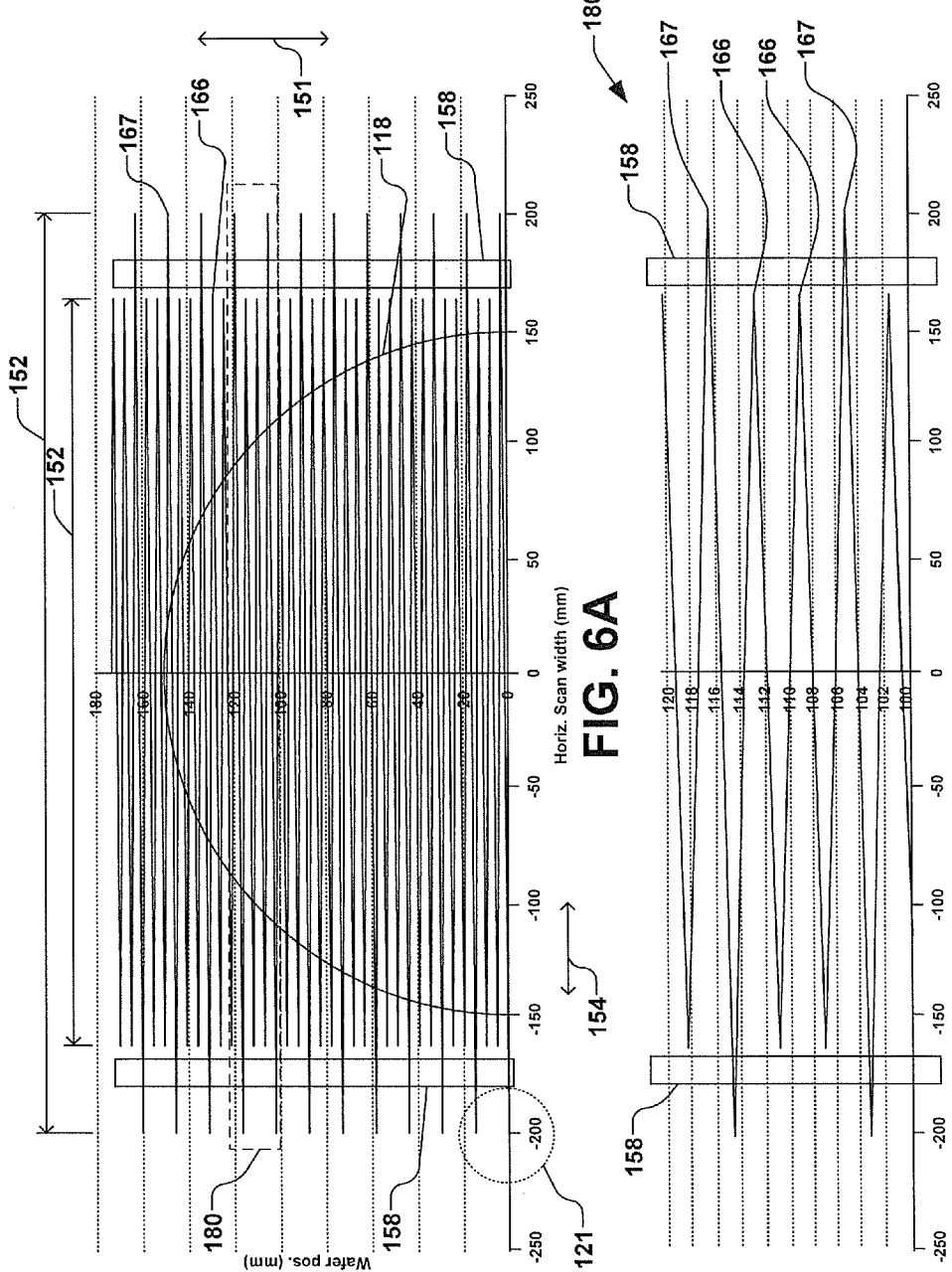

METHOD FOR ENHANCING BEAM UTILIZATION IN A SCANNED BEAM ION IMPLANTER

FIELD OF THE INVENTION

The present invention relates generally to ion implantation systems, and more specifically to a system method for improving ion beam utilization in a scanned beam ion implantation apparatus.

BACKGROUND OF THE INVENTION

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

Typical ion implantation systems include an ion source for generating electrically charged ions from ionizable source materials. The generated ions are formed into a high speed beam with the help of a strong electric field and are directed along a predetermined beam path to an implantation end station. The ion implanter may include beam forming and shaping structures extending between the ion source and the end station. The beam forming and shaping structures maintain the ion beam and bound an elongated interior cavity or passageway through which the ion beam passes en route to the end station. During operation, this passageway is typically evacuated in order to reduce the probability of ions being deflected from the predetermined beam path as a result of collisions with gas molecules.

It is common for the workpiece being implanted in the ion implantation to be a semiconductor wafer having a size much larger than the size of ion beam. In most ion implantation applications, the goal of the implantation is to deliver a precisely-controlled amount of a dopant uniformly over the entire area of the surface of the workpiece or wafer. In order to achieve the uniformity of doping utilizing an ion beam having a size significantly smaller than the workpiece area, a widely used technology is a so-called hybrid scan system, where a small-sized ion beam is swept or scanned back and forth rapidly in one direction, and the workpiece is mechanically moved along the orthogonal direction of the scanned ion beam.

One widely-used technology is serial implantation, where individual workpieces are implanted by the scanned ion beam. In order to maintain uniformity of the implantation, the ion beam current is often measured during the implantation process, wherein a beam sampling cup (e.g., a Faraday cup) is placed near an edge or reversing point of the scanned ion beam. The beam scan width is generally dictated by the position of the sampling cup(s), instead of the size of the workpiece, such that the ion beam is fully scanned past the sampling cup(s) with adequate over-scan to produce reliable measurements. Since the sampling cups are often at locations that are significantly far from the workpiece edges, the scan width on implanters utilizing such edge sampling cups are typically required to be far greater than the size of the workpiece being implanted. During times when the ion beam is not impacting the workpiece, the ion beam does not contribute to additional dosage on the workpiece, and ion beam utilization tends to suffer in such implanters.

SUMMARY OF THE INVENTION

The present disclosure presently appreciates that both ion beam utilization and accurate ion beam current measurements utilized for dosage control are both important aspects of ion implantation. Thus, the present disclosure overcomes the limitations of the prior art by providing a system, apparatus, and method for enhancing ion beam utilization in a scanned ion beam implantation system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a method and a system for increasing utilization of an ion beam. In accordance with one aspect, the method comprises providing a workpiece on a workpiece support and further providing one or more Faraday cups along a path of the ion beam, such as one or more side Faraday cups positioned along a scan path of a scanned ion beam. The one or more side Faraday cups, for example, are configured to sense a current of the ion beam near edges of a width of the scanned ion beam, wherein the one or more side Faraday cups are separated by a distance associated with a diameter of the workpiece.

In one example, the ion beam is scanned (e.g., electrostatically or magnetically) across a surface of the workpiece, wherein a narrow scan of the ion beam is generally defined by reversing a direction of the scanning of the ion beam at a position associated with an edge of the workpiece. The narrow scan, for example, is at least wide enough to uniformly irradiate the workpiece with ions from the ion beam. A wide scan of the ion beam is further generally defined by reversing a direction of the scanning of the ion beam at a position associated with an outboard region of the one or more side Faraday cups. Accordingly, a current of the ion beam is sensed via the one or more side Faraday cups concurrent with the reciprocal scanning the ion beam.

In accordance with one example, in order to increase ion beam utilization, the present disclosure mixes the narrow scans with wide scans, thereby interlacing several narrow scans with the wide scans. The number of narrow scans per each wide scan, for example, is adjustable, such as three narrow scans per one wide scan. Accordingly, a balance can be struck between a gain in ion beam utilization and a reduced frequency of beam current monitoring.

On narrow scans of the ion beam, for example, a scan width of the ion beam may not fully or adequately expose the side Faradays to the ion beam. As such, sufficient current monitoring of the ion beam that is associated with the side Faraday cups is not guaranteed for said narrow scans. Therefore, in another example of the present disclosure, the provided system and method can advantageously exclude such possibly erratic readings. For example, the present disclosure utilizes a synchronized beam current gating system and apparatus, wherein the beam current presented at the one or more side Faraday cups is either passed to a dosimetry system or blocked from the dosimetry system synchronously with the respectively interlaced wide scan(s) and narrow scan(s) of the ion beam.

For example, the one or more side Faraday cups are electrically connected to a dosimeter during wide scans of the ion beam. During narrow scans of the ion beam, the one or more side Faraday cups are electrically connected to ground, whereby any current sensed on the one or more side Faraday cups is blocked from reaching to dosimeter. As such, accurate measurement of the ion beam current is achieved, while further increasing ion beam utilization over prior art methods.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 2 is a plan view of iterative scans of an ion beam with respect to a workpiece in accordance with one example of the disclosure.

FIG. 3A illustrates a measured beam current distribution associated with an exemplary narrow scan of an ion beam illustrating a partial exposure of side Faraday cups to the ion beam in accordance with another aspect of the disclosure.

FIG. 3B illustrates a measured beam current distribution associated with an exemplary wide scan of an ion beam, illustrating a substantially full and uniform exposure of side Faraday cups to the ion beam according to yet another aspect of the disclosure.

FIG. 5A is a plan view of exemplary iterative wide scans of an ion beam with respect to a workpiece and two side Faraday cups.

FIG. 5B is an exploded view of a portion of the scanned area illustrated in FIG. 5A.

FIG. 6A is a plan view of exemplary iteratively interlaced narrow and wide scans for augmented beam utilization in accordance with another exemplary aspect.

FIG. 6B is an exploded view of a portion of the scanned area illustrated in FIG. 6A.

DETAILED DESCRIPTION OF THE INVENTION

Figure 1:
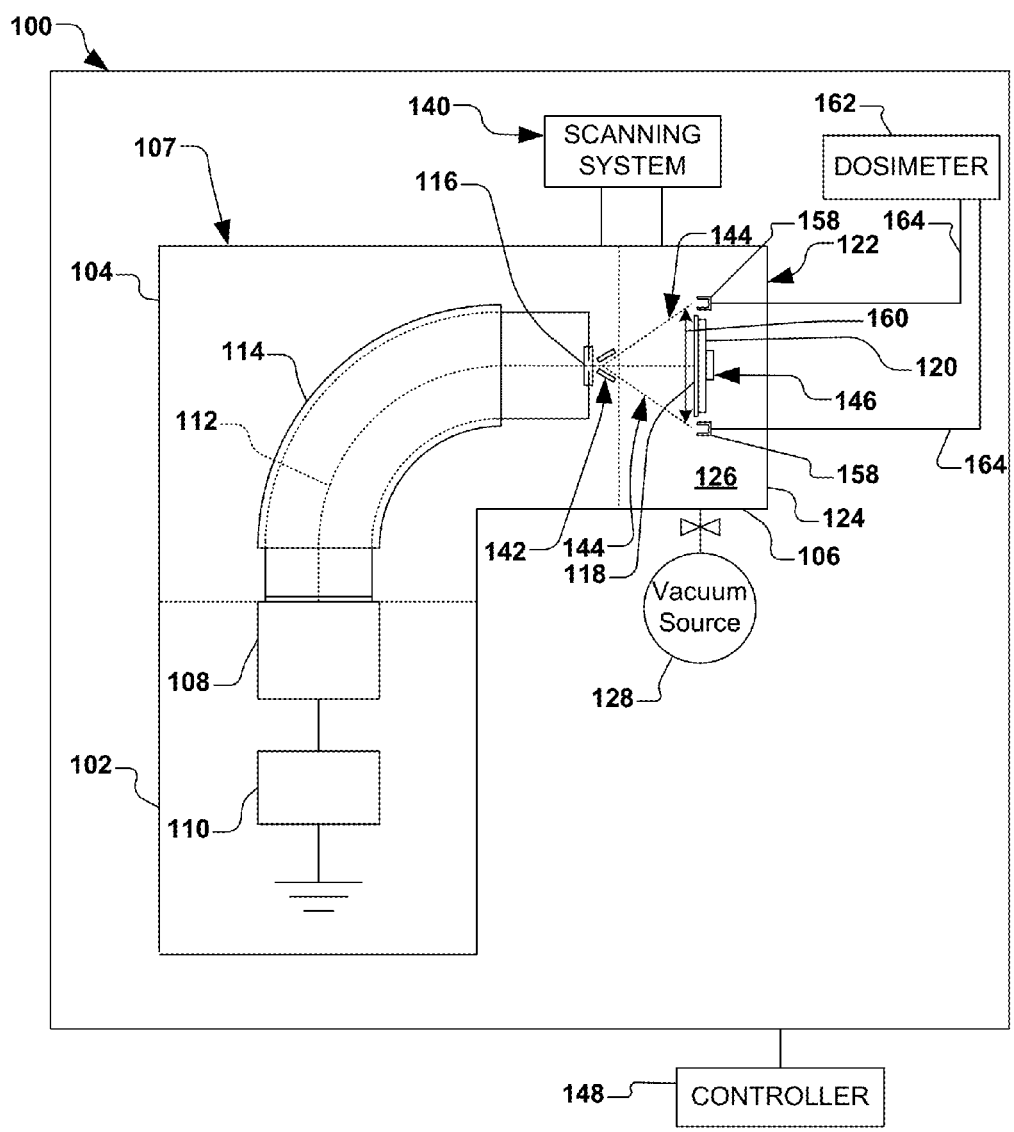
FIG. 1 is a block diagram of an exemplary ion implantation system in accordance with several aspects of the present disclosure.

The present invention is directed generally toward a system, apparatus, and method for enhancing a utilization of a scanned ion beam in an ion implantation system. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one aspect of the present disclosure, FIG. 1 illustrates an exemplary ion implantation system 100, wherein the ion implantation system, for example, comprises a terminal 102, a beamline assembly 104, and an end station 106. Generally speaking, the terminal 102, beamline assembly 104, and end station 106 define an ion implantation apparatus 107, wherein an ion source 108 in the terminal 102 is coupled to a power supply 110 to ionize a dopant gas into a plurality of ions and to form an ion beam 112. The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which resides on a support 120 (e.g., selectively clamped or mounted to an electrostatic chuck or ESC). Once embedded into the workpiece 118, the implanted ions change the physical and/or chemical properties of the workpiece. Because of this, ion implantation is used in semiconductor device fabrication and in metal finishing, as well as various applications in materials science research.

The ion beam 112, for example, has one of a circular and generally elliptical cross-section when viewed along a direction of travel of the ion beam (e.g., the z-direction). As such, the ion beam 112 of the present disclosure comprises a pencil or spot beam 121 or a scanned pencil or spot beam (e.g., the spot ion beam scanned in one or more of the x-direction and y-direction), in which ions are directed toward the end station 106, and all such forms are contemplated as falling within the scope of the disclosure, and are generically referred to as an "ion beam".

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In accordance with the present disclosure, the ion implantation apparatus 107 is configured to provide a spot ion beam 121 having a beam density associated therewith to the workpiece 118. In accordance with another example, a scanning system 140 is provided, wherein the scanning system 140 is configured to iteratively scan the spot ion beam 121 and workpiece 118 with respect to one another along one or more axes (e.g., a concurrent scan in two mutually orthogonal directions such as the x-axis direction and y-axis direction). For example, the scanning system 140 comprises a beam scanning system 142 configured to scan the spot ion beam 121 (e.g., along a "fast scan" axis associated with the x-axis), therein defining a scanned ion beam 144. The beam scanning system 142, for example, is configured to electrostatically or magnetically scan the spot ion beam 121 along the fast scan axis to define the scanned ion beam 144. The scanning system 140, for example, optionally further comprises a workpiece scanning system 146 configured to scan the workpiece 118 (e.g., along a "slow scan" axis associated with the y-axis) with respect to the spot ion beam 121. In yet another example, the workpiece scanning system 146 is configured to scan the workpiece 118 with respect to the spot ion beam 121 along the fast scan axis and slow scan axis, therein defining a 2-dimensional mechanical scan architecture.

In accordance with one aspect of the disclosure, a controller 148 is provided and configured to establish a predetermined scan pattern 150 on the workpiece 118, as illustrated in FIG. 2, wherein the workpiece is exposed to the spot ion beam 121 via a control of the scanning system 140. The controller 148 of FIG. 1, for example, is configured to control the ion beam 112, such as the beam density and current of the spot ion beam 121, as well as other properties associated with the ion implantation system 100. Further, the controller 148 is configured to control a speed of scanning of the workpiece 118 along the slow scan axis 151 illustrated in FIG. 2, as well as to control a scan width 152 associated with the scanning of the spot ion beam 121 along the fast scan axis 154 (e.g., defining the scanned ion beam 144 of FIG. 1) via a control of the scanning system 140. Accordingly, in the present example, by controlling the scanning of the workpiece 118 along the slow scan axis 151 of FIG. 2, and by controlling the scan speed and scan width 152 of the spot ion beam 121 in the fast scan axis 154 the workpiece 118 is exposed to the spot ion beam (e.g., the scanned ion beam 144) in a predetermined manner (e.g., the predetermined scan pattern 150).

It should be noted that the predetermined scan pattern 150 illustrated in FIG. 2 is an example having a generally constant scan width 152, and that various other scan patterns are contemplated as falling within the scope of the present disclosure. For example, the scan width 152 of the scanned ion beam 144 can be varied as the workpiece 118 traverses along the slow scan axis 151, such that the scanned ion beam reverses direction a predetermined distance from a circumference 156 of the workpiece (e.g., the scanned ion beam follows a geometry of the workpiece). Furthermore, the scan width 152 of the scanned ion beam 144 can be varied for other purposes, such as for attaining measurements of various properties of the ion beam, as will be further discussed hereafter.

During ion implantation into the workpiece 118 of FIG. 1, it is desirable to determine a dosage of ions implanted into the workpiece for process control and other reasons. Accordingly, one or more side Faraday cups 158 (also called sampling cups) are provided along a path 160 (e.g., along the fast scan axis 154 of FIG. 2) of the scanned ion beam 144, wherein one or more properties (e.g., a current) of the spot ion beam 121 are sensed or measured by the one or more side Faraday cups as the spot ion beam passes thereover. For example, a dosimeter 162 of FIG. 1 receives a signal 164 from the one or more side Faraday cups 158 and generally outputs the measurement of the one or more properties of the ion beam 121 to the controller 148. In the present example, the one or more side Faraday cups 158 are generally positioned outboard of the workpiece 118 (e.g., outside the circumference 156 of the workpiece 118 of FIG. 2) along the path 160 of the scanned ion beam 144, wherein the one or more side Faraday cups are separated by a distance 165 associated with a diameter of the workpiece, as illustrated in FIGS. 3A-3B.

The one or more side Faraday cups 158 in the present example are positioned outboard of the workpiece 118, wherein the scan width 152 is increased from a narrow scan 166 illustrated in FIG. 3A to a wide scan 167 illustrated in FIG. 3B in order to pass the entirety of the scanned ion beam 144 over the one or more side Faraday cups. Therefore, in implementing the one or more side Faraday cups 158, the scan width 152 is increased from just covering the workpiece 118 as illustrated in FIGS. 2 and 3A (e.g., the narrow scan 166) to the wide scan 167 of FIG. 3B. However, since such an increase in the scan width 152 does not contribute to the doping on the workpiece 118, the overall usage of ion beam 121, sometimes referred to as a beam utilization factor, decreases significantly.

Figure 4:
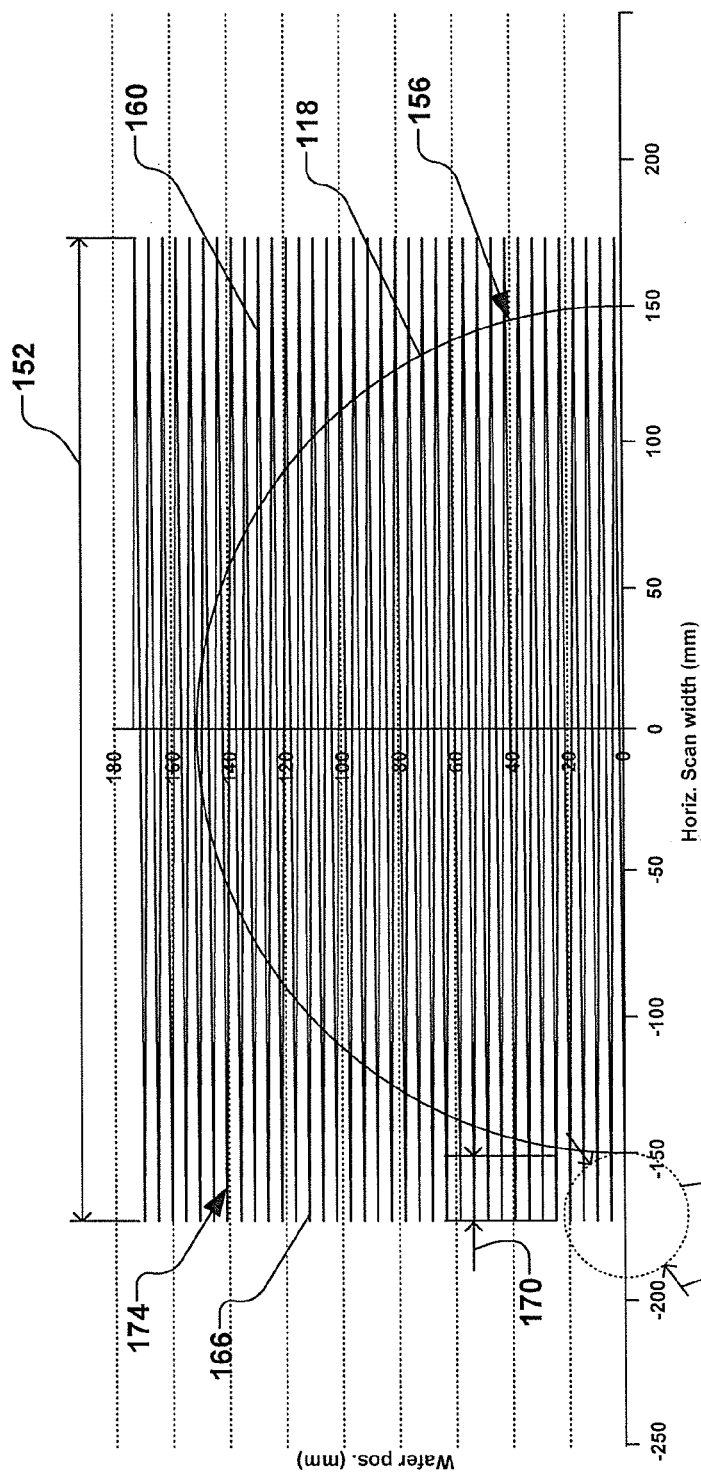
FIG. 4 is a plan view of exemplary iterative narrow scans of an ion beam with respective to a workpiece according to another aspect of the disclosure.

For example, one-half of the exemplary workpiece 118 is illustrated in FIG. 4, and is shown having a diameter of 300 mm. Assuming the ion beam 121 of FIG. 4, for example, is uniformly round and has a cross-sectional diameter 168 of 40 mm, in order to uniformly cover the workpiece 118, an overscan 170 by one-half the cross-sectional diameter of the ion beam (i.e., 20 mm) is provided beyond the circumference 156 of the workpiece in all directions. Thus, in the present example, a total scanned area 174 that is scanned by the ion beam 121 will be a square of approximately 340 mm by 340 mm (again noting that FIG. 4 only illustrates one-half of the workpiece 118). Accordingly, the beam utilization factor, or the ratio of the dosage of ions received on the workpiece 118 to the total dosage associated with the total scanned area 174, is thus approximately 61%.

The present disclosure appreciates that the beam utilization factor further decreases when the scan width 152 of the ion beam 121 is increased, such as when passing the ion beam over the above-described side Faraday cups 158, as illustrated in FIG. 3B. For example, as further illustrated in FIGS. 5A-5B, the two sampling cups 158 are placed relative to the workpiece 118 (e.g., at +/−170 mm relative to the workpiece, leading to a separation between sampling cups of 340 mm) and have a width 176 (e.g., 10 mm) associated therewith. In a manner similar to FIG. 4, in order to uniformly implant the workpiece 118 and cover the two sampling cups 158 of FIGS. 5A-5B (e.g., to achieve an adequate sampling of the ion beam 121 during the scan), the overscan 170 of one-half the size of the ion beam 121 (i.e., 20 mm) is again implemented beyond the sampling cups along the fast scan axis 154.

Accordingly, in the above example, in order for the ion beam 121 to adequately pass over the sampling cups 158 along the fast scan axis 154, the scan width 152 is increased to 400 mm (e.g., 2*(340 mm spacing+10 mm width of the sampling cup)+2*(ion beam diameter/2)), while maintaining a 340 mm scan width along the slow scan axis 151 (e.g., 300 mm diameter of the workpiece plus the ion beam diameter). FIG. 5B further provided to illustrates an exemplary magnification of a portion 178 of the scan path 160 of FIG. 5A, wherein the scan width 152 of the ion beam 121 of FIG. 5A is generally uniform. Accordingly, the beam utilization factor decreases further to approximately 52% for the path 160 comprising all wide scans 167, as illustrated in FIGS. 5A-5B.

In accordance with an exemplary aspect of the disclosure, the beam utilization factor can be advantageously increased over that seen in FIGS. 5A-5B by interlacing wide scans 167 with narrow scans 166 when utilizing the sampling cup(s) 158, as illustrated in FIGS. 6A-6B. As seen in FIG. 6A, as well as in an exemplary magnification of a portion 180 of the scan path 160 of FIG. 6A, the wide scans 167 provide adequate overscan past the sampling cups 158, while the narrow scans 166 provide uniform coverage of the ion beam 121 on the workpiece 118, yet are not wide enough to cover the sampling cups. By varying the ratio of narrow scans 166 to wide scans 167 the beam utilization factor can be likewise varied and increased over the beam utilization factor seen in FIGS. 5A-5B.

In order to gain a more clear understanding of the present disclosure, the it is presently appreciated that one concern with accurately measuring the one or more properties of the spot ion beam 121 during implantation is that the entirety of the ion beam should pass over the one or more side Faraday cups 158 in order to attain an accurate current measurement of the one or more properties of the ion beam. One reason for this is again illustrated in FIGS. 3A and 3B, wherein a beam current measurement 182 (also called beam current distribution) associated with the narrow scan 166 of FIG. 3A and wide scan 167 of FIG. 3B of the ion beam 121 are superimposed over the workpiece 118 and relative position of the side Faraday cups 158. In the narrow scan 166 of FIG. 3A, for example, the scanning of the ion beam 121 along the fast scan axis 154 of FIG. 2 reverses direction proximate to the circumference 156 or edge of the workpiece 118 (e.g., based on the position of the workpiece along the slow scan axis 151) in an attempt to increase throughput and utilization of the ion beam. Utilization of the ion beam 121 is generally associated with a ratio of time that the ion beam 121 impacts the workpiece 118 to a total time that the ion beam is formed, and it is desirable that ion beam utilization be maximized for energy conservation, workpiece throughput, and various other factors, such as cost of materials, energy, etc. involved in forming the ion beam.

However, one difficulty in maximizing the utilization of the ion beam 121 is that attempts to accurately measure various properties (e.g., current) of the ion beam during the narrow scan 166 of FIG. 3A are hampered by fixed locations of Faraday cups in what are called "edge sampling" systems, since the measured current of the ion beam drops due to the ion beam not fully passing over the Faraday cups (e.g., due to reversal of direction of the scan). On narrow scans 166, for example, the scan width 152 of FIG. 2 is chosen such that the beam utilization is maximum. For example, the scan width 152 of FIG. 2 is minimized such that the ion beam 121 just covers the workpiece uniformly, and reverses direction once the ion beam does not impact the workpiece (e.g., the ion beam reverses direction at a position associated with the circumference 156 of the workpiece). Under this condition, the side Faraday cups 158 are most likely to be subjected to beam current at a steep slope region 184 of the current distribution 182. When the side Faraday cups 158 reside at the steep slope region 184, a small variation of the ion beam 121, such as a variation in beam size, or even a small shift of location of the ion beam, will affect the measured beam current.

Alternatively, when the scan width 152 of the ion beam 121 of FIG. 2 defines the wide scan 167 illustrated in FIG. 3B, such that the ion beam fully passes over the side Faraday cups 158 (e.g., past an outboard region 186 of the side Faraday cups) during the scan of the ion beam along the fast scan axis 154, an accurate measurement of current of the ion beam may be attained. However, when implemented over the entire workpiece 118, such wide scans 167 can deleteriously affect beam utilization since more time is spent when the ion beam 121 of FIG. 2 does not impact the workpiece.

For edge sampling dose systems such as described above, the current of the ion beam 121 of FIG. 1 measured on the side Faraday cups 158 is a primary standard of beam dose on the workpiece 118 during an implant. Maintaining proper proportionality between the sampled beam current and a dose on the workpiece 118 is desirable, and the disclosure presently appreciates that it is desirable to avoid variations in currents seen at the side Faraday cups 158 due to changes in beam size, beam shift, etc. for repeatable implants. One difficulty of exposing the side Faraday cups 158 to the steep slope region 184 of the narrow scan 166 of FIG. 3A can be solved by blocking the signal 164 sent to the dosimeter 162 from the side Faraday cups of FIGS. 1 and 7 during the duration of the narrow scan 166 of FIG. 3A, but yet allowing the signal to process to the dosimeter during the wide scan 167 of FIG. 3B.

Figure 7:
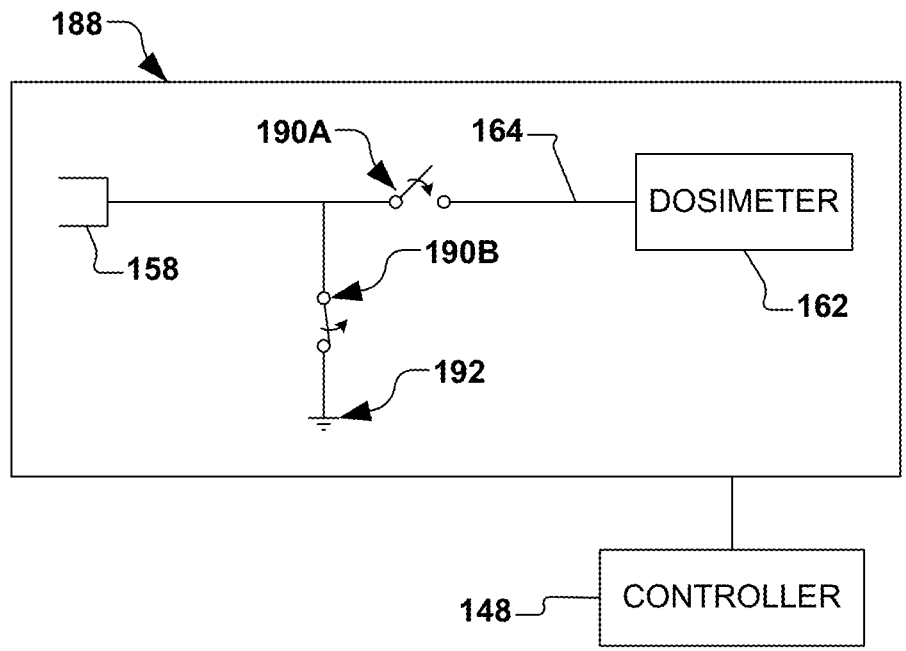
FIG. 7 illustrates an exemplary beam current switching apparatus according to another aspect of the disclosure.

In order to avoid the aforementioned variations in current seen at the side Faraday cups 158 of FIG. 1, for example, a switching apparatus 188 is provided in FIG. 7, wherein the switching apparatus is configured to electrically connect one or more side Faraday cups to the dosimeter 162 only during the wide scans 167 of FIGS. 6A-6B (also called a wide scan mode), while the switching apparatus electrically disconnects the one or more side Faraday cups from the dosimeter during narrow scans 166 (also called a narrow scan mode). For example the switching apparatus 188 of FIG. 7 electrically connects the output from the one or more side Faraday cups 158 to ground during the narrow scans 166 of FIG. 6B so that the ion beam current at the steep slope region 184 of the narrow scan of FIG. 3A does not reach the dosimeter 162 of FIG. 7.

The switching apparatus 188 of FIG. 7, for example, comprises a pair of switches 190A and 190B (e.g., semiconductor switches) configured to selectively electrically connect the one or more side Faraday cups 158 to the respective dosimeter 162 and electrical ground 192. In one example, the controller 148 is further configured to electrically connect the one or more side Faraday cups 158 to electrical ground 192 when scanning system 140 of FIG. 1 is in the narrow scan mode, and is further configured to electrically connect the one or more side Faraday cups to the dosimeter 162 when the beam scan is in the wide scan mode.

Figure 8:
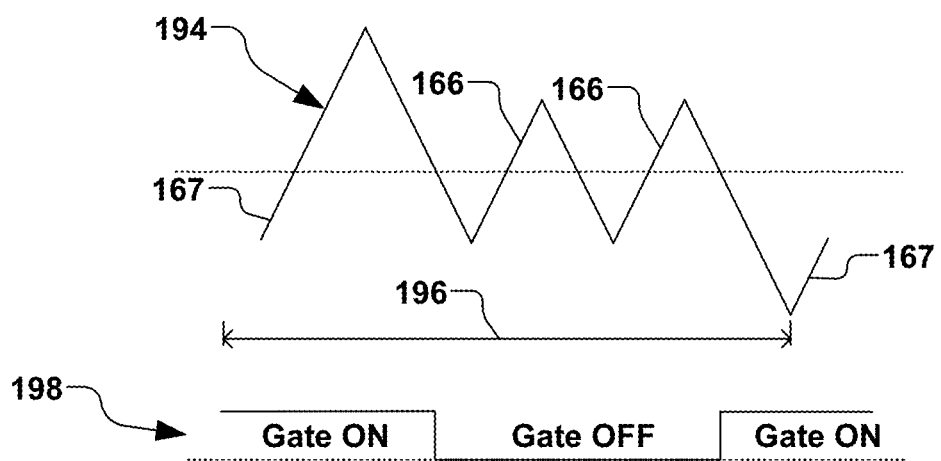
FIG. 8 illustrates an example waveform and synchronized timing chart for the electronic gating associated with an exemplary scan cycle having two narrow scans interlaced with one wide scan in accordance with yet another aspect of the disclosure.

In accordance with another exemplary aspect of the disclosure, FIG. 8 illustrates an exemplary of scan waveform 194 of a scan cycle 196 having a combination of two narrow scans 166 and one wide scan 167. It should be noted that the scan cycle 196 can have any combination of narrow scans 166 and wide scans 167. A greater ratio of narrow scans 166 to wide scans 167 will increase the utilization of the ion beam 121. However, with a high ratio of narrow scans 166 to wide scans 167, beam exposure to the one or more side Faraday cups 158 is reduced by the ratio, and it is possible that a signal to noise ratio can deteriorate in an extremely low beam current application. Therefore, if highly accurate measurement of beam current is desired at low dose operation of the ion implantation system 100 of FIG. 1, the ratio of narrow scans 166 to wide scans 167 of FIGS. 6A-6B should be minimized based on process requirements.

Below the scan waveform 194 of FIG. 8, for example, is shown a gating signal 198 to block current measurement, wherein the gating signal controls the pair of switches 190A and 190B of FIG. 7. In the present example, the dosimeter 162 of FIG. 7 is blocked (e.g., gated) by opening switch 190A and closing switch 190B for the duration while the gate signal 198 is low. With such a synchronization of gating of the dosimeter 162, current measured on the dosimeter from the one or more side Faradays 158 will result only from wide scans 167.

Figure 9:
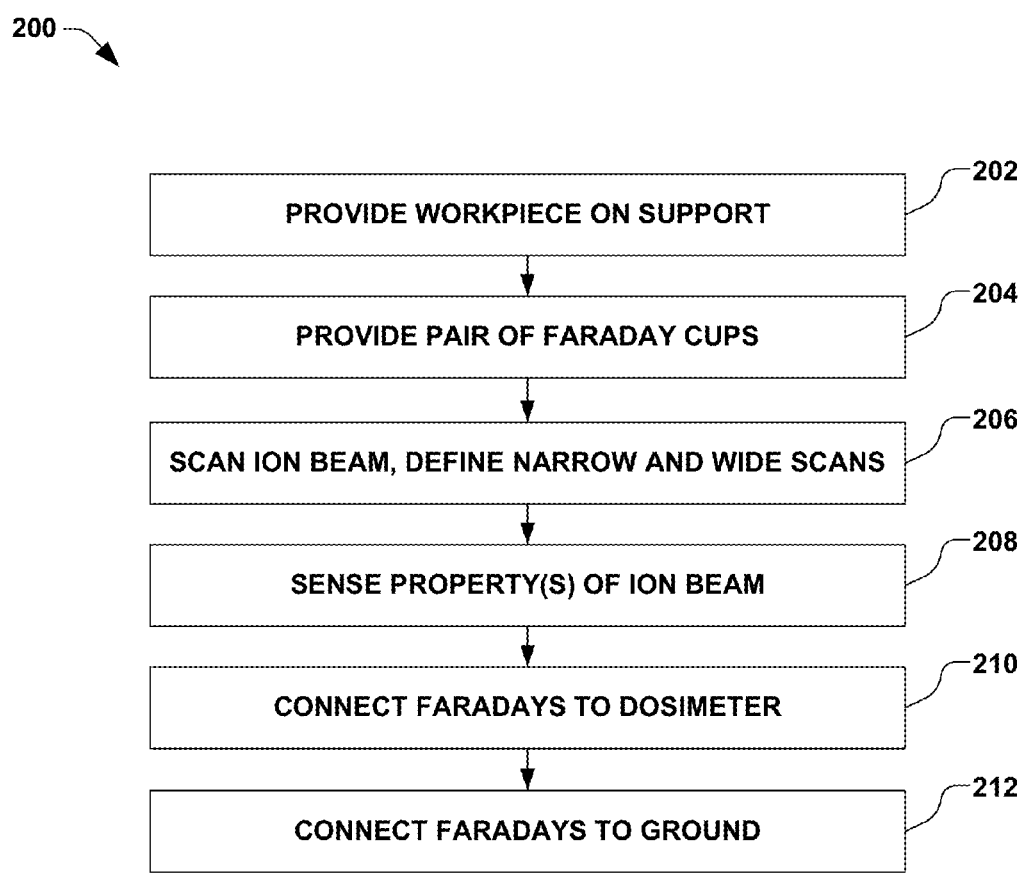
FIG. 9 illustrates a methodology for enhancing ion beam utilization in a scanned ion beam implanter, in accordance with still another aspect.

Accordingly, the present disclosure further provides a method 200 for enhancing ion beam utilization in FIG. 9, wherein the method further provides accurate measurements of one or more properties (e.g., current, dosage) of the ion beam during implantation. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 9 begins at act 202, wherein a workpiece is provided on a workpiece support, such as the workpiece 118 and support 120 of FIG. 1. In act 204 of FIG. 9, one or more side Faraday cups are provided along a path of the ion beam, wherein the one or more side Faraday cups are separated by a distance associated with a diameter of the workpiece, such as illustrated in FIGS. 3A and 3B. In act 206 of FIG. 9, the ion beam is reciprocally scanned across a surface of the workpiece, wherein a narrow scan of the ion beam is generally defined by reversing a direction of the scanning of the ion beam at a position associated with an edge of the workpiece, and wherein a wide scan of the ion beam is generally defined by reversing a direction of the scanning of the ion beam at a position associated with an outboard region of the one or more side Faraday cups. For example, the narrow scan 166 and wide scan 167 of respective FIGS. 3A-3B and 6A-6B are defined in act 206. Further, in act 208 of FIG. 9, the current or another property of the ion beam is sensed via the one or more side Faraday cups concurrent with the reciprocal scanning the ion beam of act 206.

In act 210, the one or more side Faraday cups are electrically connected to a dosimeter when the ion beam is scanned in a wide scan mode. For example, the one or more side Faraday cups are electrically connected to the dosimeter concurrent with the wide scan 167 of the ion beam of FIGS. 3B and 6A-6B. In another example, electrically connecting the one or more side Faraday cups to the dosimeter in act 210 of FIG. 9 further comprises electrically blocking the one or more side Faraday cups from electrical ground.

Accordingly, the dosimeter generally determines a current of the ion beam. In act 212, the one or more side Faraday cups are electrically connected to ground when the ion beam is scanned in a narrow scan mode. For example, electrically connecting the one or more side Faraday cups to ground in act 212 occurs concurrent with the narrow scan 166 of the ion beam 121 in FIGS. 3A and 6A-6B. In another example, electrically connecting the one or more side Faraday cups to ground in act 212 of FIG. 9 further comprises electrically blocking the one or more side Faraday cups from the dosimeter.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for increasing utilization of an ion beam, the method comprising:

provide a workpiece on a workpiece support; providing one or more side Faraday cups along a path of the ion beam and configured to sense a current of the ion beam, wherein the one or more side Faraday cups are separated from the workpiece by a distance associated with a diameter of the workpiece;

reciprocally scanning the ion beam across a surface of the workpiece, wherein a narrow scan of the ion beam is generally defined by reversing a direction of the scanning of the ion beam at a position associated with an edge of the workpiece, and wherein a wide scan of the ion beam is generally defined by reversing a direction of the scanning of the ion beam at a position associated with an outboard region of the one or more side Faraday cups, and interlacing one or more narrow scans of the ion beam with one or more wide scans of the ion beam;

sensing a current of the ion beam via the one or more side Faraday cups concurrent with the reciprocal scanning the ion beam;

selectively electrically connecting the one or more side Faraday cups to a dosimeter concurrent with the wide scan of the ion beam; and selectively electrically connecting the one or more side Faraday cups to electrical ground concurrent with the narrow scan of the ion beam.

2. The method of claim 1, wherein electrically connecting the one or more side Faraday cups to a dosimeter further comprises electrically blocking the one or more side Faraday cups from electrical ground.

3. The method of claim 1, wherein electrically connecting the one or more side Faraday cups to electrical ground further comprises electrically blocking the one or more side Faraday cups from the dosimeter.

4. The method of claim 1, wherein electrically connecting the one or more side Faraday cups to the dosimeter occurs concurrent with the wide scan of the ion beam.

5. The method of claim 1, wherein electrically connecting the one or more side Faraday cups to ground occurs concurrent with the narrow scan of the ion beam.

6. The method of claim 1, further comprising providing a gate signal associated with the scanning of the ion beam, wherein the gate signal comprises a GATE OPEN signal concurrent with the wide scan of the ion beam and a GATE CLOSED signal concurrent with the narrow scan of the ion beam, and wherein the gate signal electrically connects the one or more side Faraday cups to the dosimeter concurrent with the wide scan of the ion beam and electrically connects the one or more side Faraday cups to electrical ground concurrent with the narrow scan of the ion beam.

7. The method of claim 1, wherein the dosimeter generally determines a current of the ion beam only concurrent with the wide scan of the ion beam.

8. A method for increasing utilization of an ion beam, the method comprising:

providing a workpiece on a workpiece support;

providing one or more side Faraday cups along a path of the ion beam and configured to sense a current of the ion beam, wherein the one or more side Faraday cups are separated from the workpiece by a distance associated with a diameter of the workpiece;

reciprocally scanning the ion beam across a surface of the workpiece and interlacing one or more narrow scans of the ion beam with one or more wide scans of the ion beam, wherein the one or more narrow scans of the ion beam are generally defined by reversing a direction of the scanning of the ion beam at a position associated with an edge of the workpiece, and wherein the one or more wide scans of the ion beam are generally defined by reversing a direction of the scanning of the ion beam at a position associated with an outboard region of the one or more side Faraday cups; and measuring the current of the ion beam sensed by the one or more side Faraday cups via a dosimeter only concurrent with the wide scan of the ion beam.

9. The method of claim 8, wherein the one or more side Faraday cups are connected to ground concurrent with the one or more narrow scans of the ion beam.

10. The method of claim 8, further comprising blocking the current from the one or more side Faraday cups to the dosimeter during the one or more narrow scan of the ion beam.

11. The method of claim 8, further comprising providing a gate signal associated with the scanning of the ion beam, wherein the gate signal comprises a GATE OPEN signal concurrent with the one or more wide scans of the ion beam and a GATE CLOSED signal concurrent with the one or more narrow scans of the ion beam, and wherein the gate signal electrically connects the one or more side Faraday cups to the dosimeter concurrent with the one or more wide scans of the ion beam and electrically connects the one or more side Faraday cups to electrical ground concurrent with the one or more narrow scans of the ion beam.

12. The method of claim 8, wherein a scan width of the one or more narrow scans is generally uniform and associated with a diameter of the workpiece.

13. The method of claim 8, wherein a scan width of the one or more narrow scans varies based, at least in part, on a position of the workpiece along a slow scan axis.

14. A dosimetry switching apparatus for a scanned ion beam implantation system, the dosimetry system comprising:

a workpiece support configured to support a workpiece with respect to a scanned ion beam;

one or more side Faraday cups positioned along a path of the scanned ion beam, wherein the one or more side Faraday cups are configured to sense a current of the ion beam, and wherein the one or more side Faraday cups are separated from the workpiece by a distance associated with a diameter of the workpiece;

a dosimeter configured to determine a current of the scanned ion beam based on the current sensed by the one or more side Faraday cups; and configured to selectively electrically connect the one or more side Faraday cups to the dosimeter concurrent with a wide scan of scanned ion beam and wherein the controller is further configured to selectively electrically connect the one or more side Faraday cups to ground concurrent with a narrow scan of the scanned ion beam, wherein the narrow scan of the scanned ion beam is generally defined by reversing a direction of scanning of the scanned ion beam at a position associated with an edge of the workpiece, and wherein the wide scan of the scanned ion beam is generally defined by reversing a direction of scanning of the scanned ion beam at a position associated with an outboard region of the one or more side Faraday cups.

15. The dosimetry system of claim 14, wherein the controller comprises a pair of semiconductor switches configured to selectively electrically connect the one or more side Faraday cups to the respective dosimeter and ground.

* * * * *